United States Patent

Ma et al.

(10) Patent No.: US 9,674,110 B2
(45) Date of Patent: Jun. 6, 2017

(54) RESOURCE RELEASE METHOD, COMMUNICATION EQUIPMENT, AND NETWORK SYSTEM

(71) Applicant: Huawei Technologies Co., Ltd., Shenzhen (CN)

(72) Inventors: Jie Ma, Beijing (CN); Chuanfeng He, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/689,388

(22) Filed: Nov. 29, 2012

(65) Prior Publication Data

US 2013/0083807 A1 Apr. 4, 2013

Related U.S. Application Data

(63) Continuation of application No. PCT/CN2008/073769, filed on Dec. 26, 2008.

(30) Foreign Application Priority Data

Dec. 29, 2007 (CN) .......................... 2007 1 0307869

(51) Int. Cl.
*H04L 12/917* (2013.01)
*H04W 76/06* (2009.01)
*H04W 72/04* (2009.01)
*H04W 36/26* (2009.01)

(52) U.S. Cl.
CPC ............ *H04L 47/76* (2013.01); *H04W 72/04* (2013.01); *H04W 76/068* (2013.01); *H04W 36/26* (2013.01)

(58) Field of Classification Search
CPC ... H04W 76/06; H04W 76/068; H04W 72/04; H04W 36/26; H04L 47/76
See application file for complete search history.

(56) References Cited

U.S. PATENT DOCUMENTS

| 7,054,268 B1 | 5/2006 | Parantainen et al. |
| 7,433,337 B2 | 10/2008 | Chao et al. |
| 2006/0116156 A1 | 6/2006 | Haseba et al. |
| 2007/0042785 A1 | 2/2007 | Nakamata |

(Continued)

FOREIGN PATENT DOCUMENTS

| CN | 1678092 A | 10/2005 |
| CN | 1756415 A | 4/2006 |

(Continued)

OTHER PUBLICATIONS

International Search Report, PCT/CN2008/073769, Date of mailing Mar. 26, 2009, 4 pages.

(Continued)

*Primary Examiner* — Christopher Grey

(74) *Attorney, Agent, or Firm* — Huawei Technologies Co., Ltd.

(57) ABSTRACT

A method, a UE and a communications system for releasing resources are disclosed. When the UE is in a CELL_FACH state, a resource release indication is transmitted from a network equipment to the UE to instruct the UE to release HS-RACH resources on the UE. Upon receiving the resource release indication, the UE releases previously allocate HS-RACH resources on the UE.

15 Claims, 8 Drawing Sheets

(56) References Cited

U.S. PATENT DOCUMENTS

| | | |
|---|---|---|
| 2008/0002688 A1 | 1/2008 | Kim et al. |
| 2008/0045255 A1 | 2/2008 | Revel et al. |
| 2008/0049669 A1* | 2/2008 | Lundby et al. ............... 370/329 |
| 2008/0267118 A1* | 10/2008 | Cai et al. ...................... 370/329 |
| 2008/0311921 A1* | 12/2008 | Eckert et al. ................. 455/450 |
| 2009/0086671 A1* | 4/2009 | Pelletier et al. ............. 370/329 |
| 2009/0131052 A1 | 5/2009 | Hakola et al. |
| 2009/0225709 A1 | 9/2009 | Wager et al. |
| 2009/0268676 A1 | 10/2009 | Wigard et al. |
| 2010/0091652 A1 | 4/2010 | Lin |
| 2010/0142457 A1* | 6/2010 | Chun ................. H04W 72/1284 370/329 |
| 2010/0177716 A1* | 7/2010 | Harada ................. H04W 76/06 370/329 |
| 2010/0265919 A1* | 10/2010 | Ma ...................... H04W 76/068 370/332 |

FOREIGN PATENT DOCUMENTS

| | | |
|---|---|---|
| CN | 1784078 A | 6/2006 |
| CN | 1867166 A | 11/2006 |
| CN | 1949926 A | 4/2007 |
| CN | 101472344 B | 4/2012 |
| DE | 103 15 044 A1 | 10/2004 |
| EP | 1662729 A1 | 5/2006 |
| EP | 2645809 A2 | 10/2013 |
| WO | WO 00/76243 A1 | 12/2000 |
| WO | 2009045909 A2 | 4/2009 |

OTHER PUBLICATIONS

Chinese Office Action, Application No. 200710307869.0, Dated Feb. 12, 2010, 16 pages.

Written Opinion of the International Searching Authority, International Application No. PCT/CN2008/073769, Applicant: Huawei Technologies Co., Ltd., Dated Mar. 26, 2009, 4 pages.

Extended European Search Report, European Application No. 08870773.-1249/2224763, Applicant: Huawei Technologies Co., Ltd, Dated May 24, 2011, 6 pages.

Office Action and Partial Translation received in Chinese Application No. 200710307869.0, mailed Sep. 8, 2011, 15 pages.

Office Action received in European Application No. 08870773.2-1249, mailed May 30, 2012, 6 pages.

NSN, Nokia, "Further discussion on enhanced CELL_FACH in REL8," 3GPP TSG-RAN WG2 Meeting #59, R2-073254, Athens, Greece, Aug. 20-24, 2007, 3 pages.

United States Office Action received in U.S. Appl. No. 12/826,265, mailed Mar. 4, 2013, 10 pages.

3GPP TSG-RAN WG2#59bis R2-074390,"Layer 1/2 aspects for enhanced UL for CELL_FACH",QUALCOMM Europe, Oct. 8-12, 2007,total 9 pages.

3GPP TSG-RAN WG1#50-bis R1-074126,"L1/2 aspects for enhanced UL for CELL_FACH",Qualcomnn Europe, Oct. 8-12, 2007,total 8 pages.

3GPP TSG-RAN WG1 Meeting #50-BIS R1-074303,"Resource assignment for E-DCH access in CELL_FACH state", Nokia, Oct. 2007,total 8 pages.

3GPP TS 25.321 V7.6.0,3rd Generation Partnership Project;Technical Specification Group Radio Access Network; Medium Access Control (MAC) protocol specification(Release 7),Sep. 2007,total 146 pages.

3GPP TS 25.319 V7.3.0,3rd Generation Partnership Project;Technical Specification Group Radio Access Network; Enhanced uplink;Overall description;Stage 2(Release 7),Sep. 2007,total 44 pages.

* cited by examiner

RESOURCE RELEASE METHOD, COMMUNICATION EQUIPMENT, AND NETWORK SYSTEM

CROSS-REFERENCE TO RELATED APPLICATIONS

This application is a continuation of U.S. patent application Ser. No. 12/826,265, filed on Jun. 29, 2010, which is a continuation of International Patent Application No. PCT/CN2008/073769, filed on Dec. 26, 2008, which claims priority to Chinese Application No. 200710307869.0, filed on Dec. 29, 2007, all of which applications are incorporated herein by reference.

TECHNICAL FIELD

The present invention relates to communication technologies, and in particular, to a resource release method, communication equipment, and a network system.

BACKGROUND

To reduce the uplink signaling transmission delay and discontinuous packet transmission delay on a communication network, and optimize the existing random access technologies, a solution is proposed in the prior art. The solution uses the enhanced high-speed random access channels (HS-RACHs) to replace the random access channels (RACHs) to implement uplink transmission.

In the technical solution of the prior art, the enhanced random access procedure is as follows. When a user equipment (UE) receives a response through an acquisition indicator channel (AICH), the NodeB sends an uplink resource allocation message over a downlink channel to the accessed UE, notifying the UE of the available HS-RACH resources. The downlink channel carrying the uplink resource allocation message may be an AICH or a high speed physical downlink shared channel (HS-PDSCH). The UE uses the allocated uplink resource to send the UE ID to the NodeB. The NodeB responds to the corresponding UE by carrying the UE ID over the downlink channel. The UE may continue using the uplink resource if it receives the response within the preset time; otherwise, it stops using the uplink resource. The downlink channel carrying the UE ID may be an E-DCH absolute grant channel (E-AGCH) or an HS-PDSCH.

During the research and practice of the prior art, the inventor finds the following problem in the prior art. The solution that uses HS-RACHs to replace RACHs for uplink transmission is already proposed in the prior art, but a method for releasing HS-RACH resources is not provided.

SUMMARY OF THE INVENTION

Embodiments of the present invention provide a resource release method, communication equipment, and a network system to solve the HS-RACH resource release problem.

In order to solve the foregoing technical problem, the embodiments of the present invention are implemented through the following technical solutions.

A method for releasing resources in an embodiment of the present invention includes obtaining trigger information and determining to release an allocated HS-RACH resource according to the obtained trigger information. The allocated HS-RACH resource is released after determining to release the allocated HS-RACH resource.

A communication equipment provided in an embodiment of the present invention includes an information obtaining unit that is adapted to obtain information related to resource release. A resource releasing unit is adapted to determine to release an allocated HS-RACH resource according to the information obtained by the information obtaining unit and to release the allocated HS-RACH resource at the local end.

A network system provided in an embodiment of the present invention includes a network equipment that is adapted to obtain trigger information, to determine to release an allocated HS-RACH resource according to the obtained trigger information, and to release the allocated HS-RACH resource at the local end.

Although the solution that uses HS-RACHs to replace RACHs for uplink transmission is proposed in the prior art, a method for releasing HS-RACH resources is not provided. As a result, the HS-RACH resources in use may be occupied all the time and cannot be released. Therefore, the procedure in the technical solution of the prior art is incomplete and may not be applied currently. In contrast, the technical solution provided in embodiments of the present invention includes: obtaining trigger information; determining to release an allocated HS-RACH resource according to the obtained trigger information; and releasing the allocated HS-RACH resource after determining to release the allocated HS-RACH resource. Therefore, the HS-RACH resources in use may be released according to actual situations. This technical solution improves the procedure for using HS-RACHs to replace RACHs for uplink transmission and is more suitable for actual applications.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Embodiments of the present invention provide a method for releasing HS-RACH resources.

According to the resource release method in embodiments of the present invention, the network equipment (for example, the NodeB) or the UE may transmit the explicit signaling for HS-RACH resources releasing according to the trigger information. Explicit signaling may be indicated by physical-layer signaling, or implemented through the layer-2 control protocol data unit (PDU), or by using other methods.

The information triggering the NodeB to release resources may be:

information sent by the UE to indicate that the UE has no data to send, or to indicate that the amount of data sent by the UE is lower than the threshold, or to indicate that the UE performs cell handover;

information detected by the NodeB to indicate that the UE has no data to send, or to indicate that the amount of data sent by the UE is lower than the threshold, or to indicate that the UE performs cell handover;

information for changing the UE state, which is determined and sent by the radio network controller (RNC) according to the amount of data sent by the UE, the load of the cell where the UE resides, or the quality of service (QoS) requirement of the UE; or information detected by the NodeB to indicate that the error rate of the data sent by the UE within the preset time is higher than the preset value.

The information sent by the UE to indicate that the UE has no data to send, or to indicate that the amount of data sent by the UE is lower than the threshold, or to indicate that the UE performs cell handover is indicated by the special scheduling information (SI) sent by the UE or indicated by the special physical-layer control channel.

The SI includes the ID (4 bits) of the logical channel with the highest priority in the buffer, buffer usage of the UE, and power head room of the UE (5 bits). The buffer usage of the UE includes the ratio of the buffer size used by the data of the logical channel with the highest priority to the total buffer size and the buffer state. Whether to release resources is determined according to the buffer usage in the SI.

A method for releasing resources in embodiments of the present invention may be at least applied in the following scenarios:

(1) The UE stays in the CELL_FACH (forward access channel) state, does not perform cell handover, and has no uplink data to send.

(2) The UE does not perform cell handover, but needs to switch state, such as preparing to switch to the CELL_DCH (dedicated channel) or CELL_PCH (paging channel) state.

(3) The UE does not change the state, but needs to perform cell handover to continue sending uplink data.

The following describes the resource release methods in the preceding scenarios with reference to the accompanying drawings.

The following three embodiments describe a method for releasing resources through explicit signaling transmitted by the network side (for example, the NodeB).

First Embodiment

Figure 1:
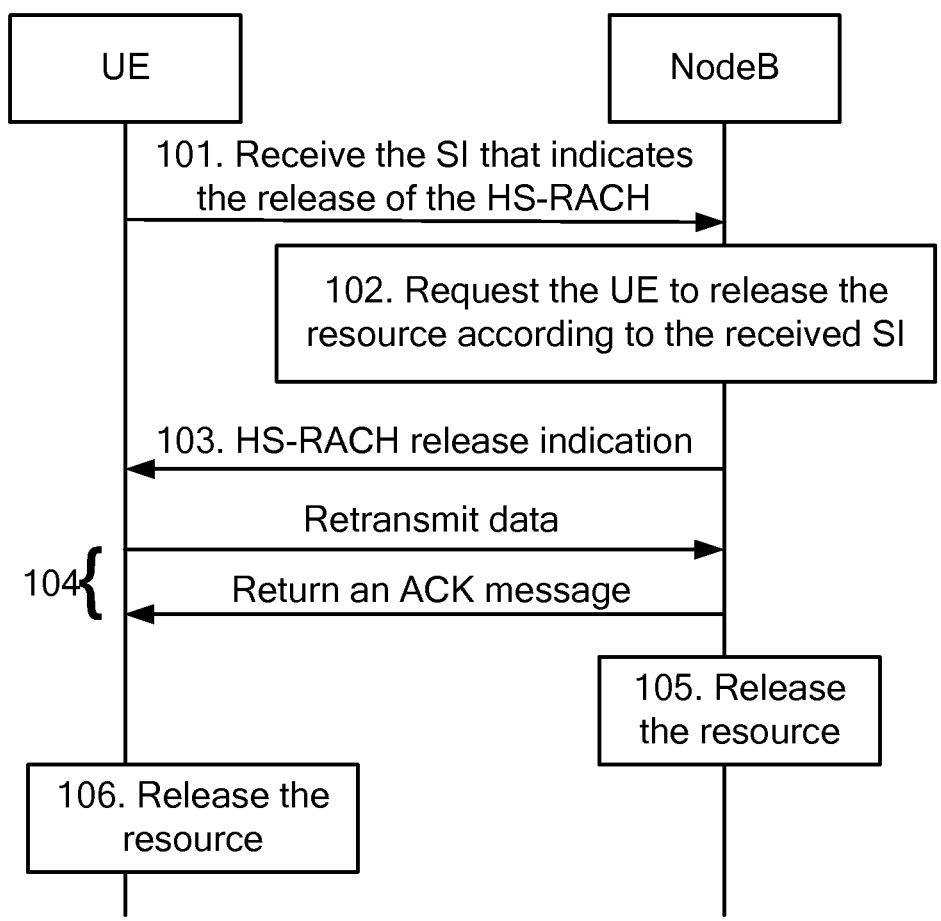
FIG. 1 is a flowchart of a method for releasing resources in a first embodiment of the present invention.

FIG. 1 is a flowchart of a method for releasing resources in the first embodiment of the present invention. This method is applied when the UE does not change the state, and does not perform cell handover.

As shown in FIG. 1, the process includes the following steps.

Step 101: The NodeB receives the SI sent by the UE.

When using the HS-RACH to send uplink data, the UE sends the SI to the NodeB periodically or when there is new data to be sent. The SI carries the data buffer size of the UE. The SI may be sent independently or carried in the uplink data.

Step 102: The NodeB determines to request the UE to release the resources according to the information in the received SI.

When finding that the data buffer usage indicated by the SI is lower than a certain threshold or is 0, the NodeB requests the UE to release resources and starts to release the resources related to the UE.

Step 103: The NodeB sends a release indication to the UE.

When the data buffer usage indicated by the SI is 0, the NodeB sends a release indication to the UE, requesting the UE to release resources. The release indication methods are as follows.

Method (a): Use the media access control (MAC) control PDU. A format combination of bits in the control PDU represents the resource release indication. In a MAC control PDU, the header contains the type indication (indicating whether the PDU is a control PDU), length of the PDU, and cyclic redundancy check (CRC) value of the PDU. The load part contains the control type bits, for example, resource allocation bit, resource release bit, SI bit, time adjustment bit, resource change bit, and quality measurement bit, etc. If a bit is set to 1, it indicates the corresponding information is carried. If a bit is set to 0, it indicates the corresponding information is not carried, or vice versa. The resource release part may contain the specific resource to be released and the release cause.

Method (b): Use the physical-layer control signaling, for example, the special E-DCH transport format combination (E-TFC) in the E-DPCCH or the special channel quality indicator (CQI) in the HS-DPCCH.

When the data buffer usage indicated by the SI is not 0 but is lower than a certain threshold, the NodeB sends a release indication to the UE, requesting the UE to release resources. The release indication method may be either (a) or (b). In addition, the release indication may also indicate the waiting time before the UE resends a random access request, so as to avoid uplink interference caused by frequent random access requests originated by the UE when the NodeB forcibly releases the resources of the UE, but the UE still has data to be sent. This waiting time may be carried in the MAC control PDU or indicated by the physical-layer signaling. The waiting time may be expressed as a multiple of a certain time unit. For example, if the waiting time unit is 125 ms and the actual waiting time is 256 ms, the waiting time is expressed as 2.

Step 104: Upon receiving the release indication, the UE sends the data to be retransmitted to the NodeB.

After receiving the release indication, the UE first retransmits the packets that are sent before the release indication is received but are not acknowledged by the NodeB through an ACK message. After receiving the release indication, the UE no longer sends new data, but retransmits only the MAC-i/MAC-E packets that are not acknowledged.

Step 105: The NodeB releases the resources related to the UE.

After correctly receiving the retransmitted packets, the NodeB formally releases the physical resources used by the UE.

Step 106: The UE releases the resources.

After retransmitting the packets and receiving the ACK messages returned by the NodeB, the UE releases the buffer data of the MAC layer, releases the process buffer and parameter tables related to physical-layer HS-RACH resources, also releases physical resources.

In addition, it is possible that the UE improperly determines the ACK messages returned by the NodeB as NACK messages or determines the NACK messages as the ACK messages, and thereby retransmits packets to the NodeB continuously. In this case, a retransmission threshold, for example, maximum waiting time or maximum number of retransmissions, may be specified for the NodeB and the UE. The values must be equal on both sides. Once the maximum waiting time or the maximum number of retransmissions is reached, the NodeB and the UE immediately release the resources respectively.

In addition to the data buffer usage indicated by the SI sent by the UE in the embodiment, the factor triggering the NodeB to determine to release resources may also be a special physical-layer control channel indication indicating that the network side has no data to send; or the NodeB detects that the uplink signals of the HS-RACH have been lower than a threshold for some time, or that all the packets from the UE within a period are incorrect, or that the UE does not upload any data within the activation period.

The resource release is not necessarily performed until data are retransmitted in embodiments of the present invention.

In addition, there may be a step before the NodeB releases resources in the first embodiment. The UE sends an HS-RACH release response to the NodeB. The NodeB releases resources after receiving the release response.

In the technical solution in the first embodiment, multiple types of information may trigger resource release, and the resource release indication may be sent in different modes, so that the resource usage keeps the same on the UE and the network side. In addition, the retransmission threshold may be set to avoid continuous data retransmission.

Second Embodiment

Figure 2:
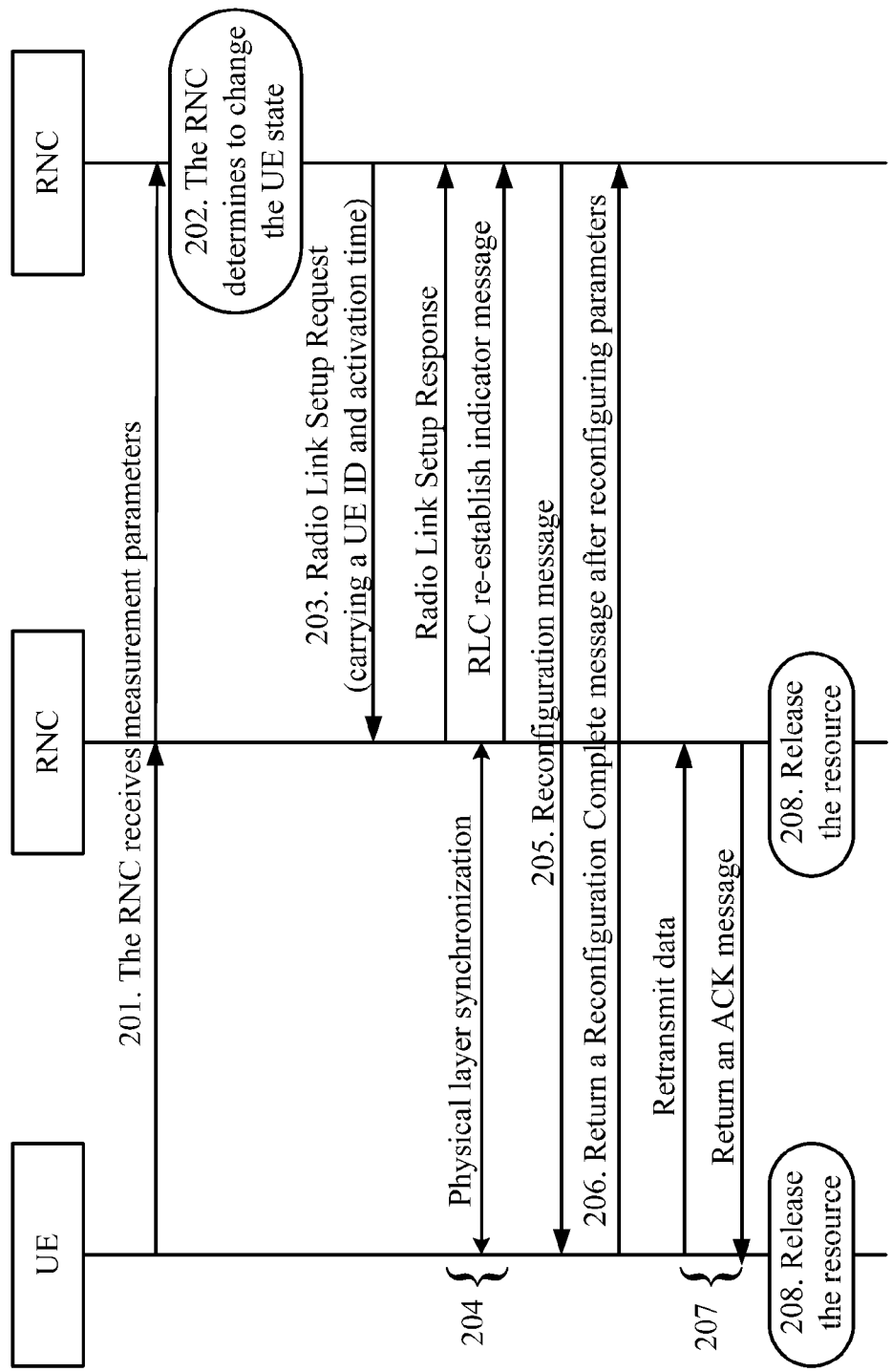
FIG. 2 is a flowchart of a method for releasing resources in a second embodiment (a) of the present invention.
Figure 3:
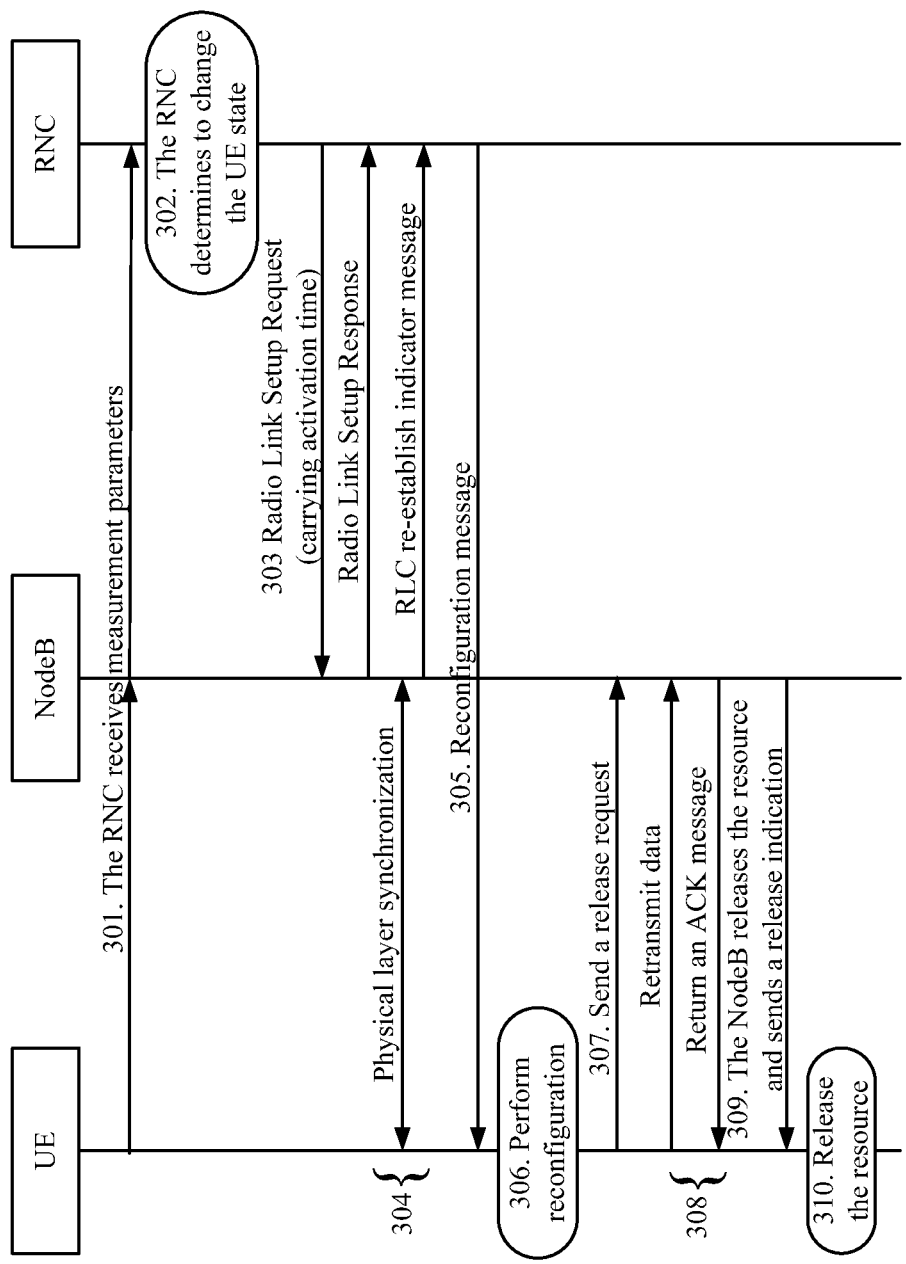
FIG. 3 is a flowchart of a method for releasing resources in a second embodiment (b) of the present invention.

The following describes a method for releasing resources when the UE does not perform cell handover but changes the state according to the second embodiment of the present invention. Two scenarios are involved. FIG. 2 is a flowchart of a method for releasing resources when the RNC requests the NodeB to release resources in the second embodiment (a). FIG. 3 is a flowchart of a method for releasing resources when the UE requests the NodeB to release resources in the second embodiment (b).

As shown in FIG. 2, the process of a method for releasing resources in the second embodiment (a) of the present invention includes the following steps.

Step 201: The RNC receives measurement parameters.

The measurement parameters received by the RNC, for example, the current service data amount of the UE or QoS requirement of the UE, are sent by the UE through the NodeB. The RNC may further measure the load of the cell where the UE resides.

Step 202: The RNC determines to change the UE state according to the measurement parameters.

The RNC determines to change the UE state, for example, to the CELL_DCH state according to the service data amount of the UE exceeds a certain threshold, the cell where the UE resides is overloaded, or the QoS of the UE does not meet the requirement.

Step 203: The RNC originates the radio link setup procedure and sends a Radio Link Setup Request message to the NodeB.

The Radio Link Setup Request message sent by the RNC carries the UE ID and activation time. The UE ID enables the NodeB to know the UE that will switch to the CELL_DCH state, which has the same effect as notifying the NodeB of the need to release resources upon UE state changes. The activation time enables the NodeB to know when to enable the radio link.

The Radio Link Setup Request message may also not carry the activation time. When the request does not carry the activation time, the NodeB enables the new physical channel immediately. However, because the RNC knows the exact activation time of the UE, it starts to receive uplink data after the activation time is reached.

Step 204: The NodeB sets up a radio link after receiving the Radio Link Setup Request message.

After receiving the Radio Link Setup Request message, the NodeB knows that the HS-RACH resource associated with the UE ID needs to be released, then sets up a radio link as requested, returns a Radio Link Setup Response message to the RNC, performs physical layer synchronization with the UE, and then sends a RLC re-establish indicator message to the RNC. The NodeB does not enable the radio link immediately but enables it when the activation time is reached.

Step 205: The RNC sends a reconfiguration message to the UE.

The RNC sends a reconfiguration message to the UE, instructing the UE to switch to the CELL_DCH state. The activation time carried in the reconfiguration message is consistent with that carried during the radio link setup procedure. In this embodiment, the RNC sends a reconfiguration message to the UE, requesting the UE to reconfigure the parameters and use the new parameters. Using the new parameters also means that the UE needs to release the original resources.

Step 206: After receiving the reconfiguration message, the UE reconfigures the parameters and returns a Reconfiguration Complete message to the RNC.

Step 207: The UE sends the data to be retransmitted to the NodeB.

The UE retransmits the packets that are sent before the reconfiguration message is received but are not acknowledged by the NodeB through ACK messages. After receiving the reconfiguration message, the UE no longer sends new data, but sends only the MAC-i/MAC-E packets that are not acknowledged.

Step 208: The UE and the NodeB use the new configurations and release the resources respectively when the activation time is reached.

After the activation time is reached, the NodeB releases the original HS-RACH resources of the UE, and starts to use the new configurations for interacting with the UE. After the UE changes the state and enables the new configurations, the original HS-RACH resources are released.

In the technical solution of the present invention, the resource release may be implemented during the reconfiguration procedure, that is, by adding two parameters (UE ID and activation time) to the Radio Link Setup Request message sent by the RNC. The UE ID enables the NodeB to know the UE that will switch to the CELL_DCH state, which has the same effect as notifying the NodeB of the need to release resources upon UE state changes. The activation time enables the NodeB and the UE to know when to enable the new configuration.

As shown in FIG. 3, the process of a method for releasing resources in the second embodiment (b) of the present invention includes the following steps.

Steps 301 and 302: These steps are the same as steps 201 and 202.

Step 303: The RNC originates the radio link setup procedure and sends a Radio Link Setup Request message to the NodeB.

The difference from step 203 is that the Radio Link Setup Request message sent by the RNC does not carry the UE ID but carries the activation time. The activation time enables the NodeB to know when to enable the radio link.

The Radio Link Setup Request message may also not carry the activation time. When the request message does not carry the activation time, the NodeB enables the new physical channel immediately. However, because the RNC knows the exact activation time of the UE, it starts to receive uplink data after the activation time is reached.

Step 304: The NodeB sets up a radio link after receiving the Radio Link Setup Request message.

After receiving the Radio Link Setup Request message, the NodeB sets up a radio link as required, sends a Radio Link Setup Response message to the RNC, and performs physical layer synchronization with the UE. After the synchronization, the NodeB sends a RLC re-establish indicator message to the RNC, but does not enable the link immediately.

Step 305: The RNC sends a reconfiguration message to the UE.

The RNC sends a reconfiguration message to the UE, instructing the UE to switch to the CELL_DCH state. The activation time carried in the reconfiguration message is consistent with that carried during the radio link setup procedure.

Step 306: After receiving the reconfiguration message, the UE reconfigures the parameters.

Step 307: The UE sends a release request to the NodeB.

The release request may carry the new SI. The UE may send the release request to the NodeB after the activation time is reached or immediately after the parameters are reconfigured.

Step 308: The UE sends the data to be retransmitted to the NodeB.

The UE retransmits the packets that are sent before the reconfiguration message is received but are not acknowledged by the NodeB through ACK messages. After receiving the reconfiguration message, the UE no longer sends new data, but sends only the MAC-i/MAC-E packets that are not acknowledged.

Step 309: The NodeB sends a release indication to the UE.

After receiving the release request and retransmitted data from the UE, the NodeB releases the original HS-RACH resources of the UE and sends a release indication to the UE. Meanwhile, the radio link newly configured by the NodeB is activated.

Step 310: After receiving the release indication, the UE releases the resources and uses the new configuration to send a Reconfiguration Complete message to the network side. The UE state change is complete.

In the preceding process, the UE may also send a release request to the NodeB after it finishes reconfiguration. The release cause carried in the request is that the UE switches to the CELL_DCH state. After receiving the release request from the UE, the NodeB sends a release indication to the UE. After the activation time is reached, the NodeB and the UE release the original HS-RACH resources of the UE at the same time. Meanwhile, the newly configured radio link between the NodeB and the UE is activated, and the UE uses the new configuration to send a Reconfiguration Complete message to the network side. The UE state change is complete.

The preceding descriptions are specific to the situation that the UE switches to the CELL_DCH state. If the UE switches to the CELL_PCH state, the process of setting up a radio link between the RNC and the NodeB is not needed because the UE in the CELL_PCH state must send a Reconfiguration Complete message according to the original configuration. In this case, after receiving the reconfiguration message from the RNC, the UE reconfigures the parameters, and then sends a Reconfiguration Complete message according to the original configuration. After receiving the ACK message from the RNC, the UE sends a release request to the NodeB, and sends the retransmitted data to the NodeB. After receiving the release request and the retransmitted data from the UE, the NodeB sends a release indication to the UE. The UE releases all the HS-RACH resources. Then the state change is complete.

The resources are not necessarily released until the data are retransmitted in the second embodiment of the present invention.

In the technical solution of this embodiment, the resource release may be implemented during the reconfiguration procedure, that is, by adding the activation time to the Radio Link Setup Request message sent by the RNC. The activation time enables the NodeB and the UE to know when to enable the new configuration.

Third Embodiment

Figure 4:
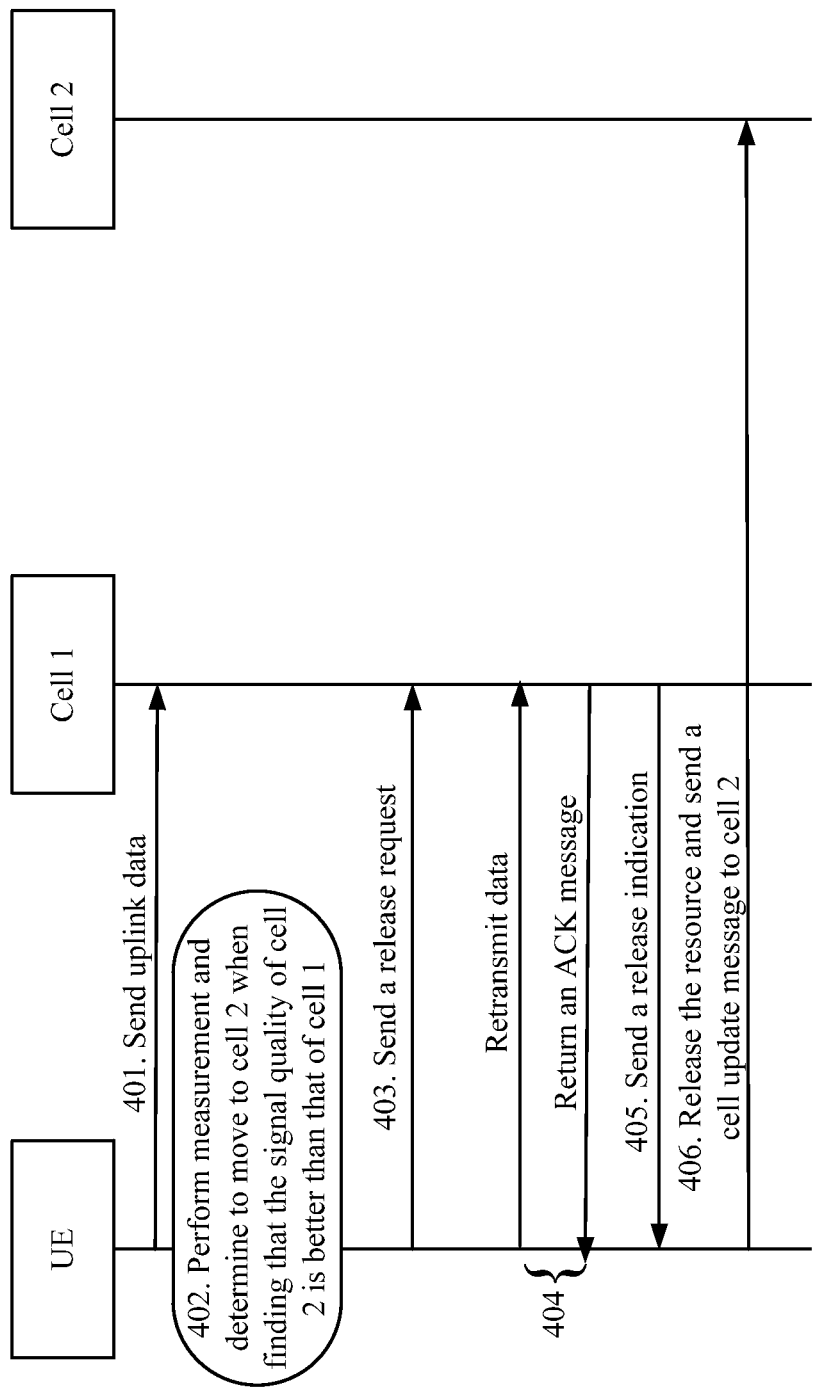
FIG. 4 is a flowchart of a method for releasing resources in a third embodiment of the present invention.

FIG. 4 is a flowchart of a method for releasing resources in the third embodiment of the present invention. This method is applied when the UE does not change the state but performs cell handover.

As shown in FIG. 4, the process of the method includes the following steps.

Step 401: The UE sends uplink data by using the HS-RACH in the current cell.

Step 402: The UE determines to reselect a cell after finding that the cell reselection conditions are met.

Here, the cell reselection condition means that a cell with good signal quality is selected when the signal quality of intra-frequency cells is poor. Assume that the UE resides in cell 1, and it determines to move to cell 2 when finding the signal quality of cell 2 is better than that of cell 1.

Step 403: The UE sends a release request to the NodeB of the original cell, that is, cell 1.

The release request sent by the UE is a special release request. For example, the ID of the logical channel with the highest priority in the SI is set to a special reserved value, for example, 1111, or all the bits in the SI are set to 0 or 1. The special value tells the NodeB of the original cell that the release cause is cell handover. Alternatively, the MAC control PDU described in the first embodiment may be used to indicate that the UE needs to release HS-RACH resources due to the cell handover.

Step 404: The UE sends the data to be retransmitted to the NodeB of original cell 1.

The UE retransmits the packets that are sent before the release request is sent but are not acknowledged by the NodeB through ACK messages. After receiving the reconfiguration message, the UE no longer sends new data, but sends only the MAC-i/MAC-E packets that are not acknowledged.

Step 405: The NodeB of original cell 1 sends a release indication to the UE.

After receiving the release request and retransmitted data from the UE, the NodeB of original cell 1 releases the original HS-RACH resources of the UE and sends a release indication to the UE.

Step 406: After receiving the release indication, the UE releases the HS-RACH resources of the original cell, and immediately uses the uplink access resources of the target cell, that is, cell 2, to send a cell update message to the target cell.

In the third embodiment of the present invention, the resources are not necessarily released until the data are retransmitted, and the resources may be released immediately after the release request is sent.

In the technical solution of the present invention, the UE may actively send a resource release request to the NodeB after determining to perform cell handover, and then the NodeB delivers a resource release indication to implement resource release.

The following describes two embodiments in which the UE sends explicit signaling for resource release.

Fourth Embodiment

Figure 5:
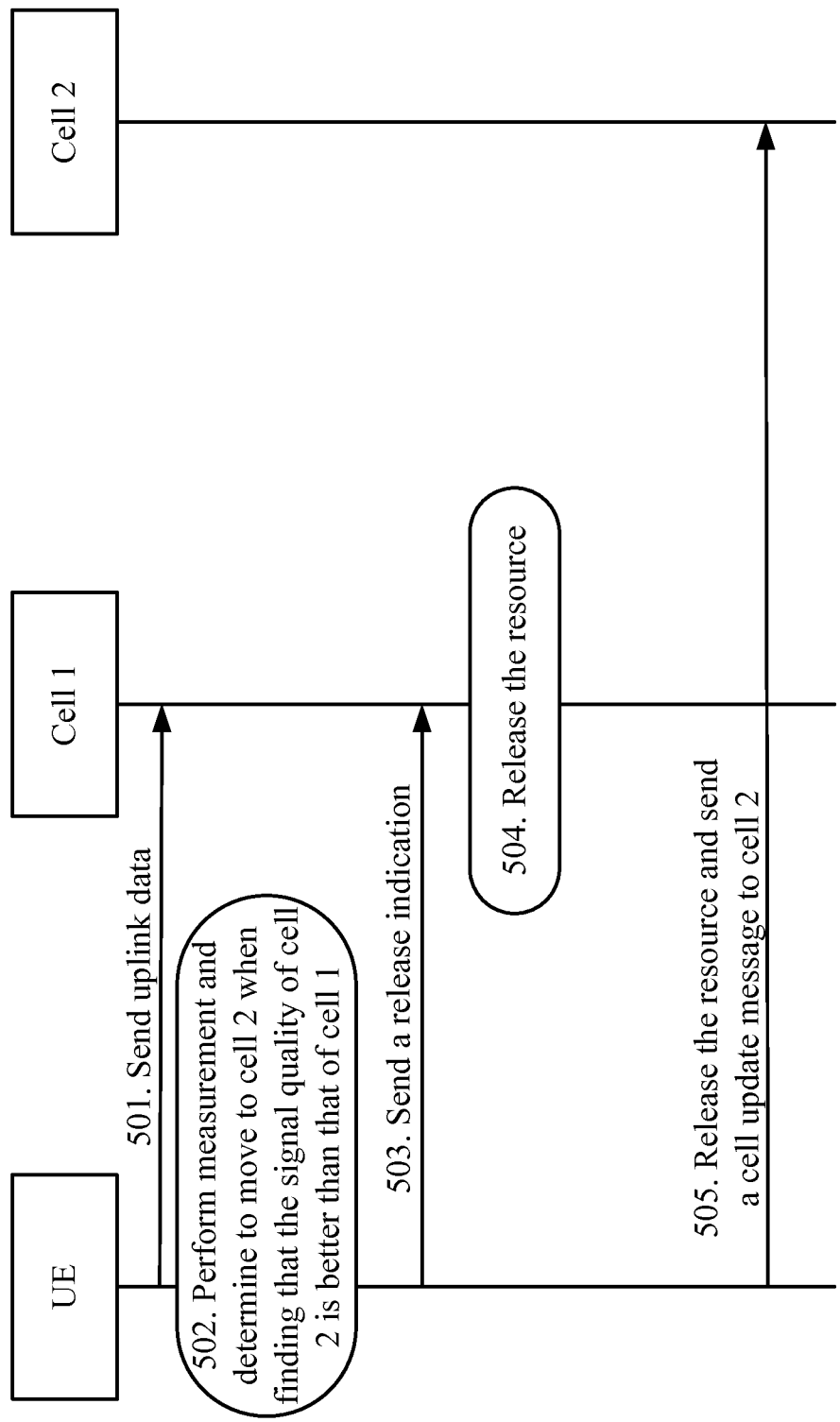
FIG. 5 is a flowchart of a method for releasing resources in a fourth embodiment of the present invention.

FIG. 5 is a flowchart of a method for releasing resources in the fourth embodiment of the present invention. This method is applied when the UE does not change the state but performs cell handover.

As shown in FIG. 5, the process of the method includes the following steps.

Step 501: The UE sends uplink data by using the HS-RACH in the current cell.

Step 502: The UE determines to reselect a cell after finding that the cell reselection conditions are met.

Here, the cell reselection condition means that a cell with good signal quality is selected when the signal quality of intra-frequency cells is poor. Assume that the UE resides in original cell 1, and it determines to move to cell 2 when finding the signal quality of cell 2 is better than that of cell 1.

Step 503: The UE sends a release indication to the NodeB of the original cell, that is, cell 1.

The release indication sent by the UE is a special release indication. For example, the ID of the logical channel with the highest priority in the SI is set to a special reserved value, for example, 1111, or all the bits in the SI are set to 0 or 1. The special value tells the NodeB of the original cell that the release cause is cell handover. Alternatively, the release indication may be implemented through the MAC control PDU.

Step 504: After receiving the release indication from the UE, the NodeB of original cell 1 releases the original HS-RACH resources of the UE, and discards the packets that are incorrectly received without waiting for the UE to retransmit the packets.

Step 505: After sending the release indication, the UE immediately releases the HS-RACH resources of the original cell, and then immediately uses the uplink access resources of target cell 2 to send a cell update message to target cell 2 without retransmitting the packets that are incorrectly acknowledged.

In the technical solution of the present invention, the UE actively sends a resource release indication to the NodeB to implement resource release after determining to perform cell handover.

Fifth Embodiment

Figure 6:
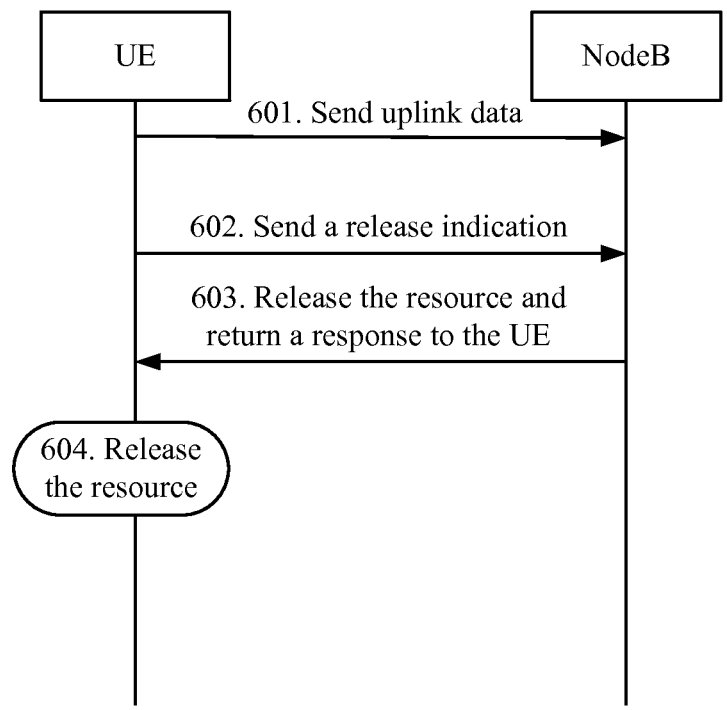
FIG. 6 is a flowchart of a method for releasing resources in a fifth embodiment of the present invention.

FIG. 6 is a flowchart of a method for releasing resources in the fifth embodiment of the present invention.

As shown in FIG. 6, the process of the method includes the following steps.

Step 601: The UE sends uplink data by using the HS-RACH in the current cell.

Step 602: The UE sends a release indication to the NodeB.

If there is no data to be sent, or the UE regards it unnecessary to continue using the HS-RACH resources when the buffered data size of the radio link control (RLC) and/or MAC layers keeps being 0 for a while, the UE may also actively release the resource. The UE notifies the NodeB on the network through an HS-RACH release indication. The release indication may be sent through the special SI, or the MAC control PDU, or physical layer signaling (for example, the special E-TFC value of the E-DPCCH or the special CQI value of the HS-DPCCH).

Step 603: After receiving the release indication from the UE, the NodeB releases the original HS-RACH resources of the UE and returns a response to the UE.

Step 604: If a response is received from the NodeB within the preset time after the UE sends the release indication, the UE directly releases the resources. If no response from the network side is received within the preset time, the UE actively releases the resources.

The UE may also directly release the resources after sending a release indication, without waiting for a response from the NodeB.

In the technical solution of the present invention, the UE actively sends a resource release indication to the NodeB, and then releases the resources after receiving a response from the NodeB.

The preceding descriptions detail a method for releasing the resources in embodiments of the present invention. Accordingly, embodiments of the present invention provide communication equipment and a network system. The communication equipment may be a UE or network equipment.

Figure 7:
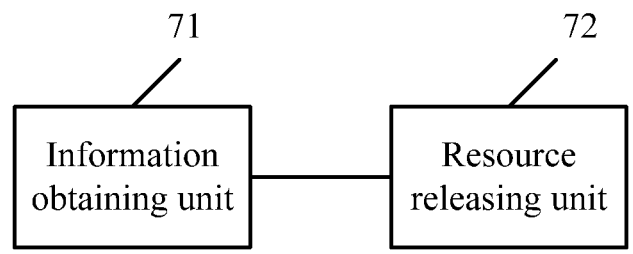
FIG. 7 shows a structure of communication equipment in an embodiment of the present invention.

FIG. 7 shows a structure of communication equipment in an embodiment of the present invention.

As shown in FIG. 7, the communication equipment includes an information obtaining unit 71 that is adapted to obtain the information related to resource release. A resource releasing unit 72 is adapted to determine to release allocated HS-RACH resources according to the information obtained by the information obtaining unit 71, and release the allocated HS-RACH resources at the local end.

The resource releasing unit 72 may include a determining unit and a processing unit.

Figure 8:
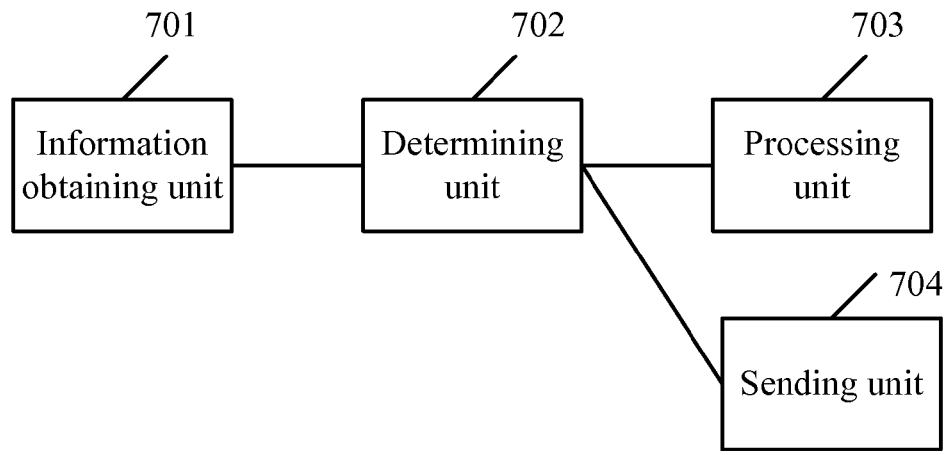
FIG. 8 shows a structure of a first UE in an embodiment of the present invention.

The communication equipment may be a UE where the resource releasing unit includes a determining unit and a processing unit. FIG. 8 shows a structure of a first UE in an embodiment of the present invention.

As shown in FIG. 8, the UE includes an information obtaining unit 701, a determining unit 702, and a processing unit 703.

The information obtaining unit 701 is adapted to obtain its detected trigger information. The trigger information obtained by the information obtaining unit 701 is the information indicating that the UE has no data to send, or indicating that the amount of data sent by the UE is lower than a threshold, or indicating that the UE performs cell handover.

The determining unit 702 is adapted to determine to release the allocated HS-RACH resources according to the trigger information obtained by the information obtaining unit 701.

The processing unit 703 is adapted to release the allocated HS-RACH resources at the local end after the determining unit 702 determines to release the allocated HS-RACH resources.

The UE further includes a sending unit 704, which is adapted to send a resource release indication to the network side after the determining unit 702 determines to release the allocated HS-RACH resources.

Figure 9:
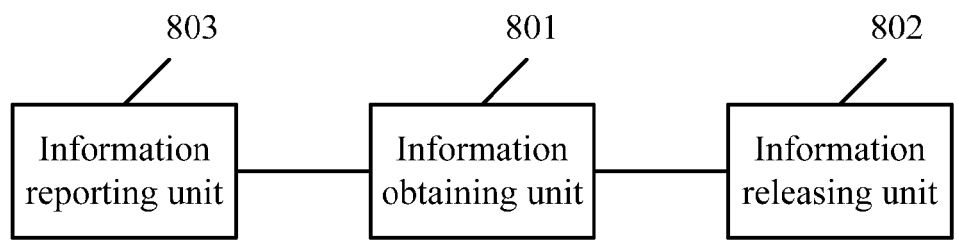
FIG. 9 shows a structure of a second UE in an embodiment of the present invention.

FIG. 9 shows a structure of a second UE in an embodiment of the present invention. The UE includes a receiving unit, equivalent to the information obtaining unit 801 and a processing unit, equivalent to the resource releasing unit 802.

The information obtaining unit 801 is adapted to obtain the resource release indication sent by the network side after the network determines to release the allocated HS-RACH resources according to the trigger information.

The resource releasing unit 802 is adapted to determine to release the allocated HS-RACH resources according to the information obtained by the information obtaining unit 801, and release the allocated HS-RACH resources at the local end.

The UE further includes an information reporting unit 803, which is adapted to send its detected trigger information to the network side before the information obtaining unit 801 obtains the resource releasing indication. The trigger information sent by the information reporting unit 803 to the network side is the information indicating that the UE has no data to send, or indicating that the amount of data sent by the UE is lower than a threshold, or indicating that the UE performs cell handover.

Figure 10:
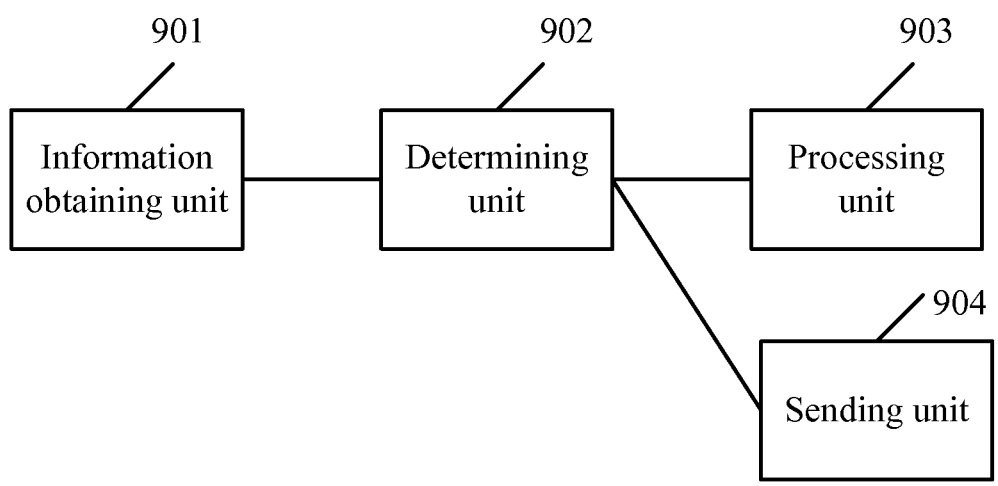
FIG. 10 shows a structure of a network equipment in an embodiment of the present invention.

The communication equipment may be network equipment where the resource releasing unit includes a determining unit and a processing unit. FIG. 10 shows a structure of a network equipment in an embodiment of the present invention.

As shown in FIG. 10, the network equipment includes an information obtaining unit 901, a determining unit 902, and a processing unit 903.

The information obtaining unit 901 is adapted to obtain trigger information. The trigger information obtained by the information obtaining unit 901 may be: the trigger information sent by the UE or the trigger information obtained after detecting the UE.

Specifically, the trigger information obtained by the information obtaining unit 901 may be:

the information sent by the UE to indicate that the UE has no data to send, or to indicate that the amount of data sent by the UE is lower than the threshold, or to indicate that the UE performs cell handover; or the information detected by the information obtaining unit 901 to indicate that the UE has no data to send, or to indicate that the amount of data sent by the UE is lower than the threshold, or to indicate that the UE performs cell handover; or the information for changing the UE state, which is determined and sent by the RNC according to the amount of data sent by the UE, the load of the cell where the UE resides, or the QoS requirement of the UE; or the information detected by the information obtaining unit 901 to indicate that the error rate of the data sent by the UE within the preset time is higher than a preset value.

The determining unit 902 is adapted to determine to release the allocated HS-RACH resources according to the trigger information obtained by the information obtaining unit 901.

The processing unit 903 is adapted to release the allocated HS-RACH resources at the local end after the determining unit 902 determines to release the allocated HS-RACH resources.

The network equipment may further include a sending unit 904, which is adapted to send a resource release indication to the UE after the determining unit 902 determines to release the allocated HS-RACH resources.

Figure 11:
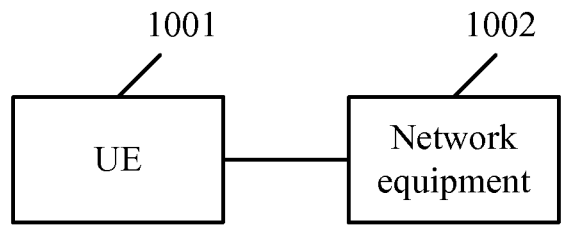
FIG. 11 shows a structure of a network system in an embodiment of the present invention.

FIG. 11 shows a structure of a network system in an embodiment of the present invention.

The network system includes a first equipment and a second equipment. The first equipment is a UE and the second equipment is a network equipment, or vice versa.

As shown in FIG. 11, the UE is marked with 1001 and the network equipment is marked with 1002.

In a first mode, the network system includes a UE 1001 that is adapted to obtain trigger information, to determine to release the allocated HS-RACH resources according to the obtained trigger information, and to release the allocated HS-RACH resources at the local end. A network equipment 1002 is adapted to release the allocated HS-RACH resources at the local end after the UE 1001 determines to release the allocated HS-RACH resources.

In a second mode, the network system includes a network equipment 1002 that is adapted to obtain trigger information, to determine to release the allocated HS-RACH resources according to the obtained trigger information, and to release the allocated HS-RACH resources at the local end. A UE 1001 is adapted to release the allocated HS-RACH resources at the local end after the network equipment 1002 determines to release the allocated HS-RACH resources.

To conclude, though the solution that uses HS-RACHs to replace RACHs for uplink transmission is proposed in the prior art, a method for releasing HS-RACH resources is not provided. Then the HS-RACH resources in use may be occupied all the time and cannot be released. Therefore, the procedure in the technical solution of the prior art is incomplete and may not be applied currently. In contrast, the technical solution provided in embodiments of the present invention includes obtaining trigger information; determining to release the allocated HS-RACH resource according to the obtained trigger information; and releasing the allocated HS-RACH resource after determining to release the allocated HS-RACH resource. Therefore, the HS-RACH resources in use may be released according to actual situations. This technical solution improves the procedure for using HS-RACHs to replace RACHs for uplink transmission and may be applied practically.

Further, embodiments of the present invention implement resource release notification through explicit signaling, thus keeping the resource usage of the UE and the network consistent, simplifying the release procedure, and improving the resource utilization.

Persons of ordinary skill in the art may understand that all or part of the steps of the method according to the embodiments of the present invention may be implemented by a program instructing relevant hardware. The program may be stored in a non-transitory computer readable storage medium, such as a read-only memory (ROM), a magnetic disk or a compact disk read-only memory (CD-ROM).

The above is a detailed description of a resource release method, a communication equipment, and a network system in embodiments of the present invention. Those of ordinary skill in the art can make variations and modifications to the present invention in terms of the specific implementations and application scopes according to the ideas of the present invention. Therefore, the specification shall not be construed as limitations to the present invention.

What is claimed is:

1. A user equipment (UE) comprising:
a transmitter configured to send uplink data to a network equipment using allocated high speed random access channel (HS-RACH) resources and transmit an empty buffer status report indicating that the UE has no data for transmission to the network equipment;
a receiver configured to receive a resource release indication from the network equipment, the received release indication being configured to instruct the UE to release the allocated (HS-RACH) resources; and a processor configured to release the allocated HS-RACH resources of the UE in response to the resource release indication, wherein the UE is in a Cell_Forward Access Channel (CELL_FACH) state.

2. The UE of claim 1, wherein the resource release indication is included in a media access control (MAC) control packet data unit (PDU) sent to the UE.

3. The UE of claim 1, wherein the resource release indication is included in a physical layer control signaling sent to the UE.

4. The UE of claim 1, wherein the empty buffer status report is transmitted to the network equipment through scheduling information (SI).

5. The UE of claim 1, wherein the empty buffer status report is transmitted to the network equipment through a media access control (MAC) control packet data unit (PDU).

6. A method for releasing resources, comprising:
sending, by a user equipment (UE) in a Cell_Forward Access Channel (CELL_FACH) state, uplink data to a network equipment using allocated high speed random access channel (HS-RACH) resources;
transmitting, by the UE, an empty buffer status report indicating that the UE has no data for transmission to the network equipment;
receiving, by the UE, a resource release indication from the network equipment, the received release indication being configured to instruct the UE to release the allocated HS-RACH resources;
releasing, by the UE, the allocated HS-RACH resources of the UE in response to the received resource release indication.

7. The method of claim 6, wherein the resource release indication is included in a media access control (MAC) control packet data unit (PDU) sent to the UE.

8. The method of claim 6, wherein the resource release indication is included in a physical layer control signaling sent to the UE.

9. The method of claim 6, wherein the empty buffer status report is transmitted to the network equipment through scheduling information (SI).

10. The method of claim 6, wherein the empty buffer status report is transmitted by the UE through a layer 2 (L2) signaling.

11. A user equipment (UE) comprising:
a transmitter to send uplink data to a network equipment using allocated high speed random access channel (HS-RACH) resources and transmit an empty buffer status report indicating that the UE has no data for transmission to the network equipment;
a receiver to receive a resource release indication from the network equipment, the received release indication instructing the UE to release the allocated HS-RACH resources; and
a processor to release the allocated HS-RACH resources of the UE in response to the resource release indication, wherein the UE is in a Cell_Forward Access Channel (CELL_FACH) state.

12. The UE of claim 11, wherein the resource release indication is included in a media access control (MAC) control packet data unit (PDU) sent to the UE.

13. The UE of claim 11, wherein the resource release indication is included in a physical layer control signaling sent to the UE.

14. The UE of claim 11, wherein the empty buffer status report is transmitted to the network equipment through scheduling information (SI).

15. The UE of claim 11, wherein the empty buffer status report is transmitted to the network equipment through a media access control (MAC) control packet data unit (PDU).

* * * * *

UNITED STATES PATENT AND TRADEMARK OFFICE
CERTIFICATE OF CORRECTION

PATENT NO. : 9,674,110 B2  Page 1 of 1
APPLICATION NO. : 13/689388
DATED : June 6, 2017
INVENTOR(S) : Jie Ma and Chuanfang He It is certified that error appears in the above-identified patent and that said Letters Patent is hereby corrected as shown below:

On the Title Page

(63) Related U.S. Application Data, after "Continuation" please insert --of Application No. 12/826,265, filed on June 29, 2010, which is a continuation of--.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*